(12) United States Patent
Wu et al.

(10) Patent No.: US 7,476,106 B1
(45) Date of Patent: Jan. 13, 2009

(54) ROTATABLE SIGNAL SOCKET

(75) Inventors: Cheng-Yu Wu, Taipei (TW);
Cheng-Hsiang Chuang, Taipei (TW);
Kun-Hui Lai, Taipei (TW); Hsieh-Chun Tseng, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/898,465

(22) Filed: Sep. 12, 2007

(51) Int. Cl.
*H01R 12/00* (2006.01)

(52) U.S. Cl. .............................. 439/67; 439/31; 439/165

(58) Field of Classification Search .................... 439/11, 439/31, 65, 67, 77, 640, 131, 165
See application file for complete search history.

(56) References Cited

U.S. PATENT DOCUMENTS 5,174,761 A * 12/1992 Kodaira ...................... 439/31
5,995,373 A * 11/1999 Nagai .......................... 361/755

* cited by examiner

*Primary Examiner*—Tho D Ta
(74) *Attorney, Agent, or Firm*—Muncy, Geissler, Olds & Lowe, PLLC

(57) ABSTRACT

A rotatable signal socket includes a fixing part, a connecting part, and a flexible printed circuit board (FPCB). The rotatable signal socket is assembled on a printed circuit board (PCB) of an electronic device for connecting a signal cable to the PCB. The fixing part is fixed on the PCB. One end of the connecting part is pivoted to the fixing part in order to rotate relative to the fixing part and the PCB. The signal cable is inserted into the other end of the connecting part. The FPCB extends from the fixing part to the connecting part, so as to electrically connect the PCB and the signal cable, thus providing a signal socket that is easy to be assembled and occupies little space.

2 Claims, 6 Drawing Sheets

ROTATABLE SIGNAL SOCKET

BACKGROUND OF THE INVENTION

1. Field of Invention

The present invention relates to a signal connecting apparatus of an electronic device. More particularly, the present invention relates to a rotatable signal socket capable of facilitating the assembly of a signal cable.

2. Related Art

Generally, a signal socket of an electronic device is directly fixed on a PCB, and is electrically connected to a circuit unit of the PCB. For example, the slots of various communication interfaces on the mainboard of a personal computer are disposed in this manner. Peripheral devices, that intend to achieve signal connection with the circuit unit of the mainboard, such as hard disc drive and optical disc drive, all need to form electrical connection by inserting a signal cable into the slot of the corresponding communication interface.

For a desktop personal computer, as there is relatively sufficient space inside the case, and for the convenience of assembly, the signal cables of the peripheral devices are perpendicularly inserted into the mainboard, i.e., the signal cables are perpendicular to the mainboard. However, for a notebook personal computer, in order to meet the characteristics of being light, thin, and portable, the space allocation inside its case is made quite compact, such that the above perpendicular inserting manner of the signal cable used in a desktop personal computer cannot be applied to the mainboard of a notebook personal computer.

The communication interface slots of a notebook personal computer are generally assembled to lie on the mainboard, so as to reduce the occupied space. In this manner, the thickness of the case of the notebook personal computer can be effectively controlled. However, as the allocation of electronic elements inside the notebook personal computer is compact, quite a lot of electronic elements are disposed peripheral to the communication interface slots. When an assembler intends to insert the signal cables of peripheral devices (such as a keyboard, a display, and a touchpad) into the communication interface slots that lie on the mainboard, it is easy to be blocked by the electronic elements peripheral to the communication interface slots, thus making it difficult to assemble the signal cables, or making it a must to adopt other tools to carry out the assembly. The above situation usually results in problems in assembly, and a lot of manpower and time for assembly are wasted, such that the assembly efficiency is lowered and the production capacity drops.

SUMMARY OF THE INVENTION

In the prior art, as the communication slots on the mainboard of a notebook computer are limited by the space inside the case, it is quite difficult to assemble the signal cables. Accordingly, the present invention is mainly directed to provide a rotatable signal socket, for facilitating the assembly of a signal cable to a communication slot.

In order to achieve the above objective, a rotatable signal socket including a fixing part, a connecting part, and an FPCB is provided. The rotatable signal socket is assembled on a PCB of an electronic device for connecting a signal cable to the PCB. The PCB of the electronic device can be, but not limited to, the mainboard of a notebook personal computer, and the signal cable can be, but not limited to, a signal cable of a peripheral device to be electrically connected to the mainboard of the notebook personal computer. The fixing part is fixed on the PCB. One end of the connecting part is pivoted to the fixing part, such that the connecting part can be set to rotate relative to the PCB, and the single cable is inserted into the other end of the connecting part. The FPCB extends from the fixing part to the connecting part, so as to electrically connect the PCB and the signal cable.

The efficacy of the present invention is that the connecting part is pivoted to the fixing part, and the FPCB is adopted as a medium for transmitting signals, so the user can move the connecting part to an angle which is easy for the assembly of the signal cable. Therefore, the signal cable can be assembled more effectively, which saves manpower and time for assembly, and in addition, it does not need too much disposing space.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The above description of the content of the present invention and the following illustration of the embodiments are intended to demonstrate and explain the principle of the present invention and to provide further explanations of the claims of the present invention.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The objectives, structures, features, and functions of the present invention will be illustrated in detail below accompanied with the embodiments.

Figure 1:
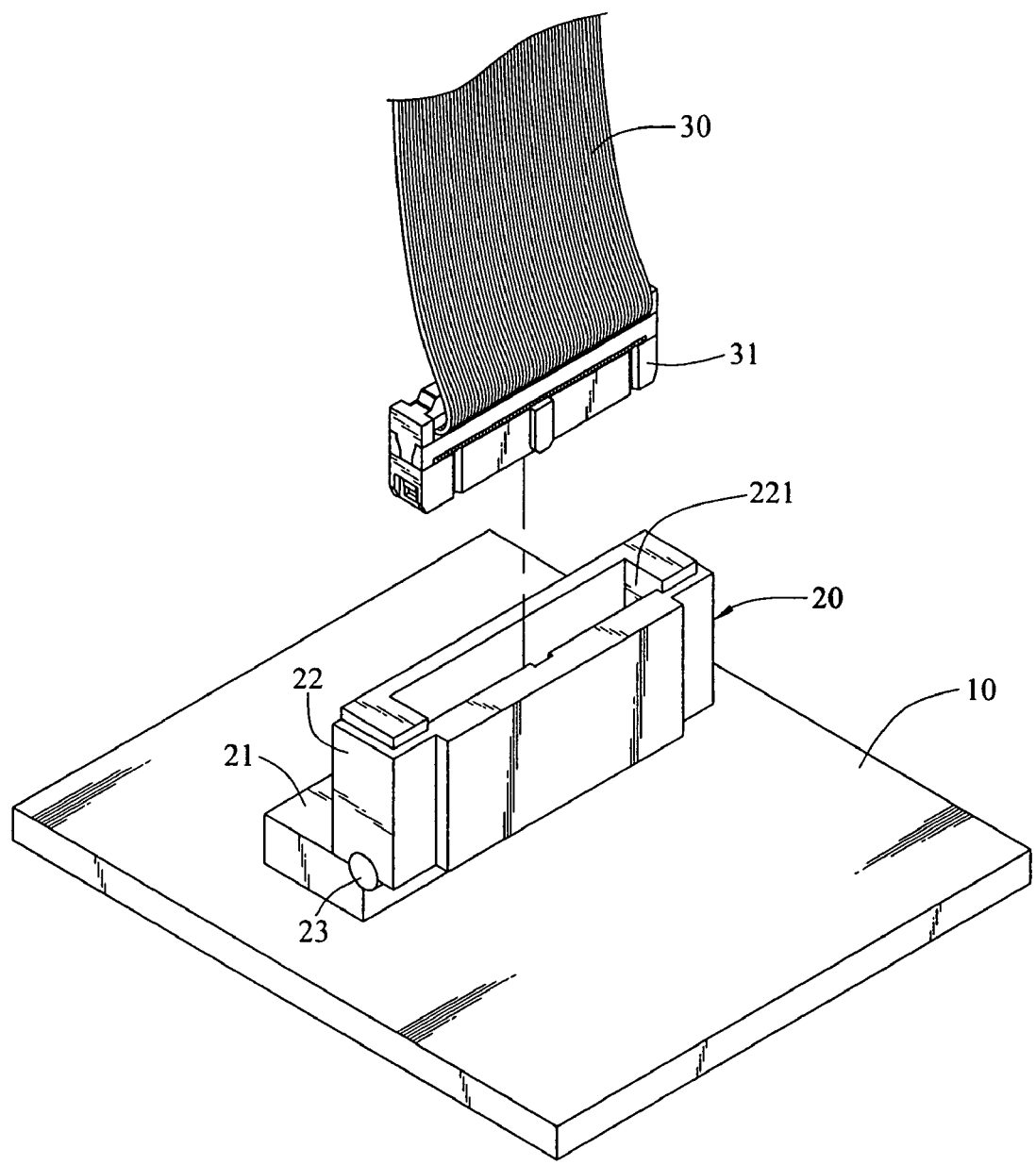
FIG. 1 is a spatial exploded view of the signal socket and the signal cable according to the present invention.
Figure 2:
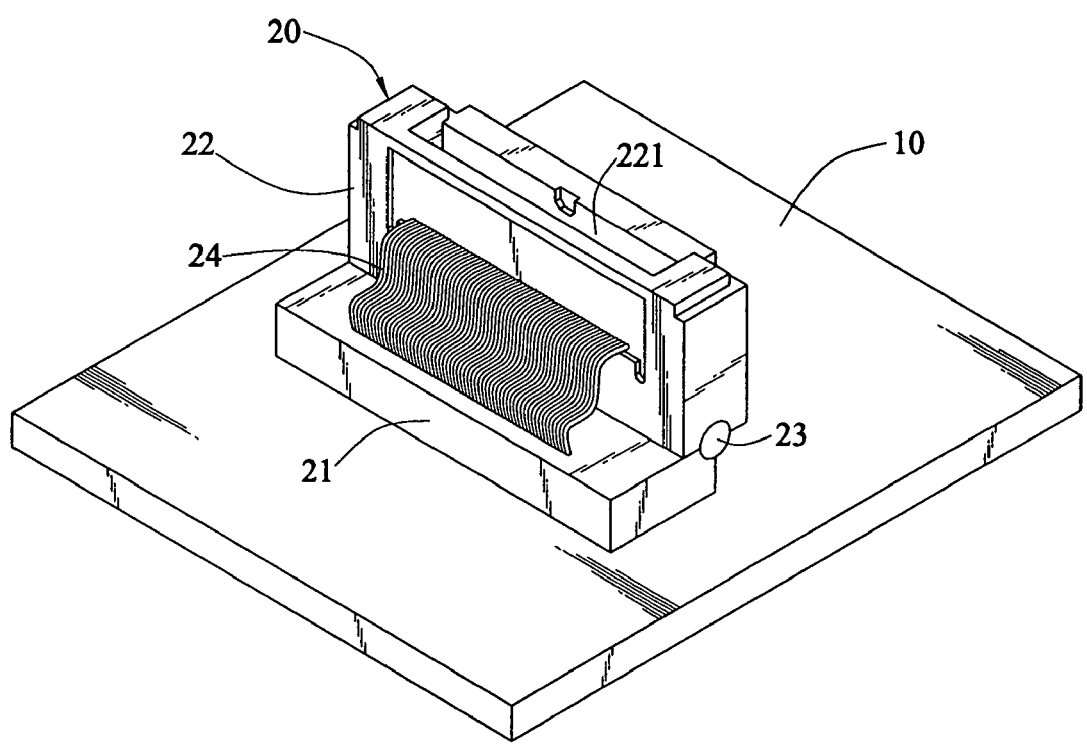
FIG. 2 is a schematic spatial view of the signal socket and the PCB according to the present invention.

Referring to FIGS. 1 and 2, a rotatable signal socket 20 including a fixing part 21, a connecting part 22, a rotating shaft 23, and an FPCB 24 is provided. The rotatable signal socket 20 is assembled on a PCB 10 of an electronic device for connecting a signal cable 30 to the PCB 10, such that an electric signal can be transmitted between the PCB 10 and the signal cable 30 through the FPCB 24 (that is, the PCB 10 is electrically connected to the signal cable 30). The PCB 10 can be, but not limited to, a PCB within the case of a thin electronic device, for example, the mainboard of a notebook personal computer. The signal cable 30 can be, but not limited to, a signal cable of a peripheral device to be electrically connected to the mainboard of the notebook personal computer, in which the peripheral device is, for example, a keyboard or a touchpad.

Figure 3:
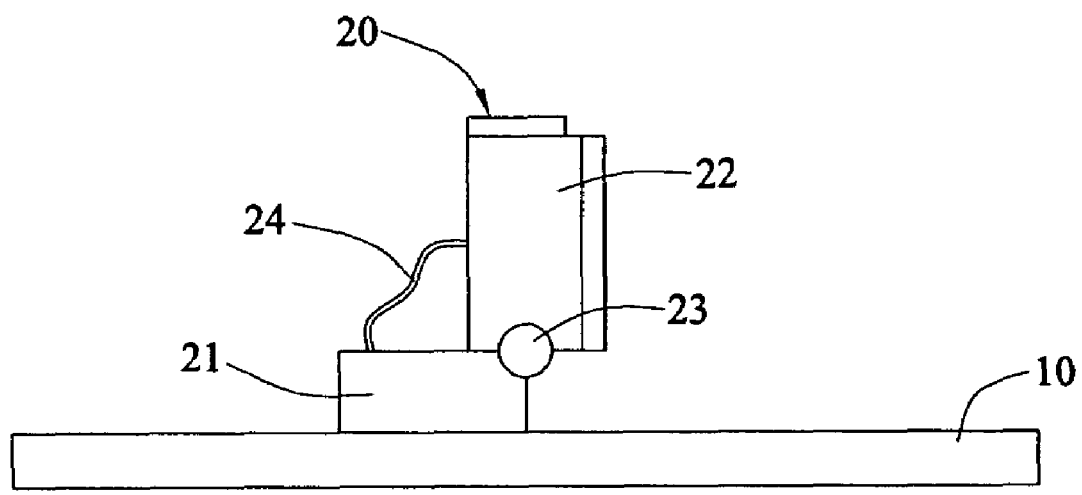
FIG. 3 is a side view showing that the signal socket is perpendicular to the PCB according to the present invention.
Figure 4:
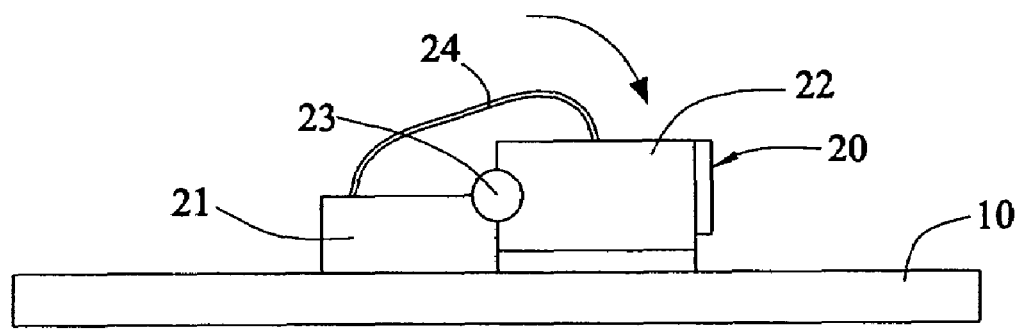
FIG. 4 is a side view showing that the signal socket lies on the PCB according to the present invention.

Referring to FIGS. 2, 3, and 4, the fixing part 21 has a plurality of metal pins (not shown), and the PCB 10 has jacks (not shown) corresponding to the metal pins of the fixing part 21. Each metal pin of the fixing part 21 is inserted into the corresponding jack in the PCB 10, so as to fix the fixing part 21 on the PCB 10. One end of the connecting part 22 is pivoted to one side of the top surface of the fixing part 21 through the rotating shaft 23, such that the connecting part 22 can be set to rotate relative to the PCB 10. Besides, the connecting part 22 has a slot 221. The front end of the signal cable 30 has a connector 31, and the signal cable 30 is inserted into the slot 221 of the connecting part 22 through the connector 31, such that the signal cable 30 is inserted into the other end of the connecting part 22. The slot 221 has a plurality of metal pins (not shown) corresponding to the connector 31, and the metal pins of the slot 221 contact and are electrically connected to the connector 31.

The FPCB 24 extends from the fixing part 21 to the connecting part 22, such that two ends of the FPCB are respectively inserted into the fixing part 21 and the connecting part 22, and the middle section (the part that is not inserted into the fixing part 21 nor the connecting part 22) of the FPCB 24 is exposed out of the fixing part 21 and the connecting part 22, i.e. the middle section of the FPCB 24 is exposed out of the rotating shaft 23. One end of the FPCB 24 is inserted into the fixing part 21 and is electrically connected to the metal pins of the fixing part 21, so as to be electrically connected to the PCB 10 through the metal pins of the fixing part 21. The other end of the FPCB 24 is inserted into the slot 221 of the connecting part 22 and is electrically connected to the metal pins in the slot 221, so as to be electrically connected to the signal cable 30 through the metal pins in the slot 221. Moreover, as the FPCB 24 is flexible and can be bent and deformed with the rotation of the connecting part 22, the FPCB 24 can be prevented from being torn when the fixing part 21 rotates and shifts relative to the connecting part 22, and remain electrically connected to the PCB 10. After the signal cable 30 is inserted into the slot 221 of the connecting part 22, the connector 31 is electrically connected to the FPCB 24, so as to electrically connect the PCB 10 and the signal cable 30, such that an electric signal can be transmitted between the PCB 10 and the signal cable 30 through the FPCB 24.

Figure 5:
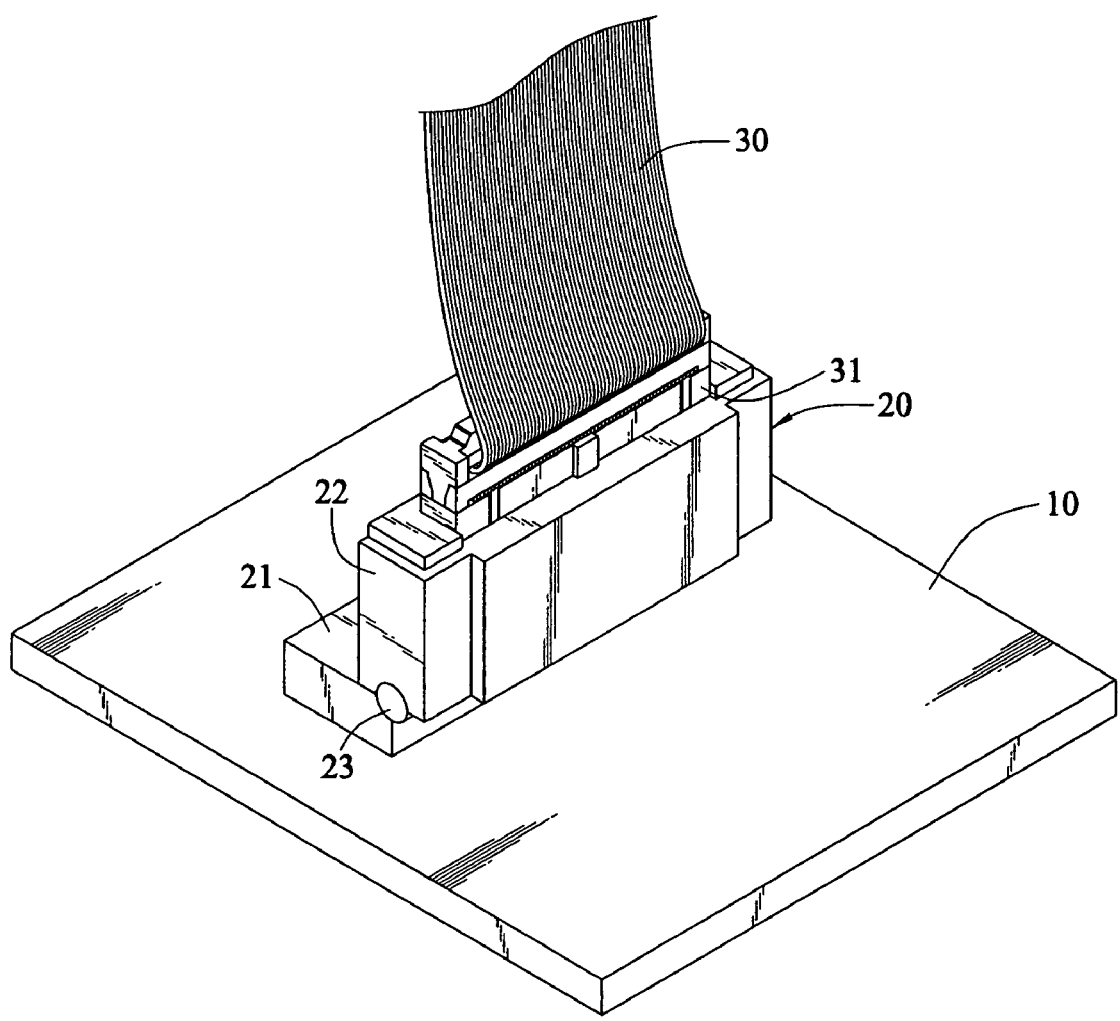
FIG. 5 is a schematic spatial view showing that the signal cable is inserted into the signal socket according to the present invention.
Figure 6:
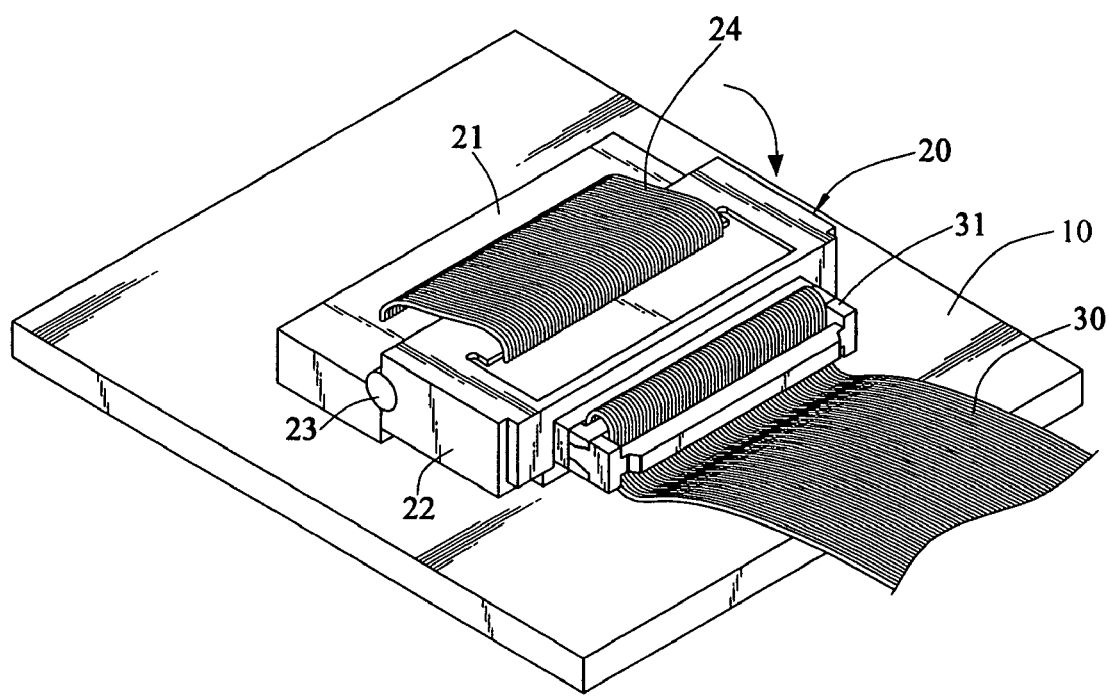
FIG. 6 is a schematic spatial view showing that the signal cable is inserted into the signal socket according to the present invention.

Referring to FIGS. 5 and 6, when the signal cable 30 of a peripheral device in an electronic device is to be installed on the PCB 10, the user only has to directly move the connecting part 22 of the signal socket 20 by hand and make the connecting part 22 stand on the PCB 10, thus leaving enough assembly space on the PCB 10. Next, the user aligns the connector 31 of the signal cable 30 with the slot 221 of the connecting part 22 and inserts the connector 31 into the slot 221, so as to make the signal cable 30 electrically connected to the PCB 10. Finally, the user again moves the connecting part 22 to lie on the PCB 10 by hand, thereby completing the whole assembly process.

In the present invention, the connecting part 22 of the signal socket 20 is pivoted to the fixing part 21, and the FPCB 24 is adopted as a medium for transmitting electric signals, so the user can move the connecting part 22 to an angle which is easy for the assembly of the signal cable 30. Therefore, the signal cable 30 can be assembled more effectively, which saves manpower and time for assembly, and in addition, it does not need too much disposing space, thus satisfying the requirement of a thin electronic device on its internal space allocation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A rotatable signal socket, assembled on a printed circuit board (PCB) of a notebook computer, for connecting a signal cable to the PCB, the rotatable signal socket comprising:
    a fixing part, fixed on the PCB;
    a connecting part, wherein one end of the connecting part is pivoted to the fixing part to rotate relative to the PCB, and the signal cable is inserted into the other end of the connecting part;
    a rotating shaft through which the connecting part is pivoted to the fixing part; and
    a flexible printed circuit board (FPCB), extending from the fixing part to the connecting part, so as to electrically connect the PCB and the signal cable, wherein a middle section of the flexible printed circuit board is exposed out of the fixing part, the connecting part and the rotating shaft.

2. The rotatable signal socket as claimed in claim 1, wherein the connecting part has a slot, provided for a connector of the signal cable to be inserted therein.

* * * * *